United States Patent [19]

Inagaki et al.

[11] Patent Number: 5,772,768
[45] Date of Patent: Jun. 30, 1998

[54] PRINTING APPARATUS AND METHOD

[75] Inventors: Noriyuki Inagaki, Osaka; Toru Hattori, Neyagawa; Toshinori Mimura, Katano, all of Japan

[73] Assignee: Matsushita Electric Industrial Co., Ltd., Kadoma, Japan

[21] Appl. No.: 523,118

[22] Filed: Sep. 1, 1995

[30] Foreign Application Priority Data

Sep. 5, 1994 [JP] Japan .................................. 6-210803

[51] Int. Cl.⁶ .................................................. B05C 11/00
[52] U.S. Cl. ...................... 118/688; 118/320; 228/180.1; 228/47.1; 228/49.1; 156/356; 156/362
[58] Field of Search ..................... 118/668, 669, 118/676, 320; 156/362, 356; 427/282; 228/47.1, 49.1, 180.1, 49.5; 29/740, 840

[56] References Cited

U.S. PATENT DOCUMENTS

| | | |
|---|---|---|
| 3,543,679 | 12/1970 | Wahl . |
| 4,814,198 | 3/1989 | Baecklund . |
| 4,945,829 | 8/1990 | Ericsson . |
| 4,953,459 | 9/1990 | Ericsson . |
| 4,981,074 | 1/1991 | Machita et al. . |
| 5,108,024 | 4/1992 | Kazem-Goudarzi et al. . |
| 5,134,932 | 8/1992 | Fujino . |
| 5,226,361 | 7/1993 | Grant et al. . |
| 5,232,736 | 8/1993 | Tribbey et al. . |

FOREIGN PATENT DOCUMENTS

| | | |
|---|---|---|
| 0 259 776 | 9/1987 | European Pat. Off. . |
| 61-14956 | 1/1986 | Japan . |
| 4-347637 | 12/1992 | Japan . |
| 1115115 | 9/1984 | U.S.S.R. . |
| 1 564 003 | 4/1980 | United Kingdom . |

Primary Examiner—Donald E. Czaja
Assistant Examiner—Calvin Padgett
Attorney, Agent, or Firm—Wenderoth, Lind & Ponack

[57] ABSTRACT

A printing apparatus includes a loading section for guiding wiring boards into the apparatus, a printing section equipped with a mask for printing a conductive material onto each of the wiring boards, a position detecting device for detecting a position of the wiring board held by the holding device, an alignment section for positionally correcting the mask or wiring board held by the holding device on the basis of an output signal from the position detecting device, and a transfer device having holding device for holding the wiring boards and turning to transfer the holding device and stop the holding device at the loading, printing, and alignment sections at the same time so that loading, printing, and alignment operations are simultaneously performed.

5 Claims, 3 Drawing Sheets

PRINTING APPARATUS AND METHOD

BACKGROUND OF THE INVENTION

The present invention relates to printing apparatus and method which automatically print a conductive material such as a solder paste, gold, silver, and copper alloy to surfaces of wiring boards such as printed circuit boards, ceramic circuit boards, etc.

In accordance with the recent trend is to mount electronic components more and more compactly with higher density to wiring boards. Therefore it is necessary to provide a solder paste printing apparatus for printing a solder paste on the wiring boards which is improved in accuracy and in efficiency.

Referring to a conventional solder paste printing apparatus shown in FIG. 5, a wiring board 2 such as a printed circuit board or the like, held on a horizontal plane of an XYθZ table 1, is moved to below a printing mask 3, so that a solder paste can to be printed thereon. The apparatus is provided with an XY robot 5 for moving a position recognition camera 4 in X-axis and Y-axis directions and a uniaxial robot 7 having a printing squeegee head 6 loaded thereon. A cleaning mechanism 8 for cleaning the mask 3 is also provided in the apparatus adjacently to the mask 3. Moreover, a loading mechanism 11 is installed along a transfer path from a loading guide rail 9 introducing the wiring board 2 to an unloading guide rail 10.

The wiring board 2 is introduced in a direction of an arrow 12 on the guide rail 9 and is transferred onto the XYθZ table 1 by the loading mechanism 11, and positioned and held at the position.

After a reference position of the wiring board 2 is recognized by the position recognition camera 4, a reference position of the mask 3 is recognized. The mask 3 has openings corresponding in shape to a wiring pattern of the wiring board 2. The openings represent the reference position of the mask 3.

The XYθZ table 1 is moved based on a signal from the position recognition data with the openings of the mask 3 serving as the reference position. While the wiring board 2 is thus positionally corrected by the table 1 is held immediately below the mask 3, the wiring board 2 is moved a predetermined distance up in the held state, generally approximately 0.5 mm although the distance differs depending on a printing accuracy. Thereafter, the squeegee head 6 runs in a direction of an arrow 13 and presses an upper surface of the mask 3 with a constant pressure. A solder paste is supplied onto the wiring board 2 through the openings of the mask 3 in the above manner, and then a printing process is finished.

Then, the XYθZ table 1 and wiring board 2 descend to the original height, and the wiring board 2 is separated from the mask 3 is moved onto the unloading guide rail 10 by the loading mechanism 11 and sent out in a direction of an arrow 14 to a next step.

Since the openings of the mask 3 clog after the aforementioned printing process is repeated several times, the mask 3 is regularly cleaned by the cleaning mechanism 8, for example, a cleaning roller, an air blower, an ultrasonic cleaning means or the like.

A series of operations, i.e., loading of wiring boards, positional recognition, printing, and unloading operations is sequentially carried out in the printing apparatus constituted as above, resulting in a low working efficiency in the printing process. For example, even if a printing speed is set at 20 mm/sec to print a 300 mm×300 mm wiring board, the apparatus consumes 25–30sec per sheet of wiring board. The interval from the loading section to the unloading section through the XYθZ table and printing section is so long that it is difficult to increase productivity per facility area.

SUMMARY OF THE INVENTION

The object of the present invention is therefore to provide a printing apparatus and method of high accuracy which can enhance productivity.

In accomplishing these and other objects, according to one aspect of the present invention, there is provided a printing apparatus comprising:

a loading section for guiding wiring boards into the apparatus;

a printing section equipped with a mask for printing a conductive material onto each of the wiring boards;

a position detecting means for detecting a position of the wiring board held by the holding means;

an alignment section for positionally correcting the mask or wiring board held by the holding means on the basis of an output signal from the position detecting means; and a transfer means having holding means for holding the wiring boards and turning to transfer the holding means and stop the holding means at the loading, printing, and alignment sections at the same time so that loading, printing, and alignment operations are simultaneously performed.

According to another aspect of the present invention, there is provided a printing method comprising:

guiding wiring boards into the apparatus at a loading section;

holding the wiring boards on a transfer means by holding means;

detecting a position of the wiring board held by the holding means;

positionally correcting a printing mask or the wiring board held by the holding means on the basis of an output signal from the position detecting means at an alignment section by a position detecting means; and printing a conductive material onto the wiring board with the mask used at a printing section at the same time as a time when the wiring board held by the holding means and transferred to the loading section is guided into the apparatus in the loading step and when the wiring board held by the holding means and transferred to the alignment section is positionally corrected in the correcting step.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENT

Figure 1:
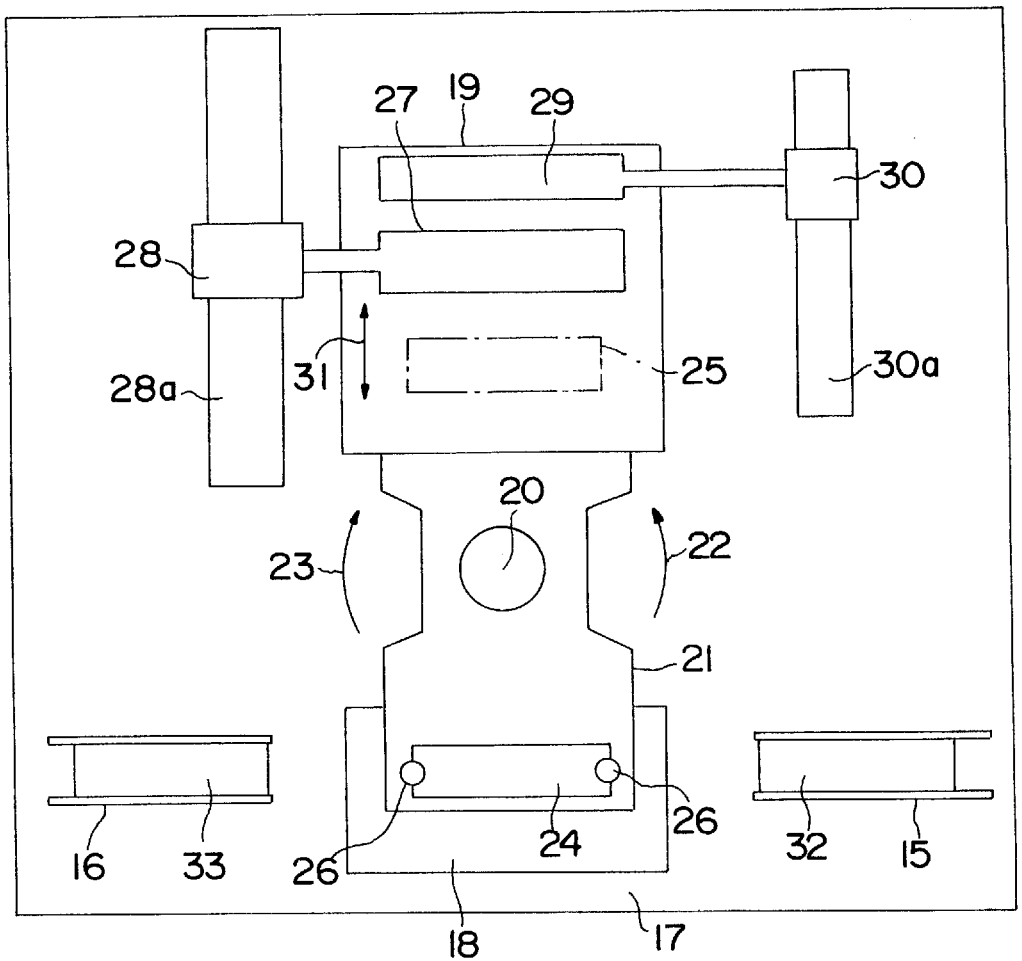
FIG. 1 is a plan view showing a solder paste printing apparatus in accordance with one embodiment of the present invention which can perform a solder paste printing method.

Before the description of the present invention proceeds, it is to be noted that like parts are designated by like reference numerals throughout the accompanying drawings.

Preferred embodiments of the present invention will be depicted hereinbelow with reference to the drawings.

A solder paste printing apparatus shown in FIG. 1 according to one embodiment of the present invention can perform a solder paste printing method in one embodiment of the present invention and has a loading section 17 between a loading guide rail 15 and an unloading guide rail 16, with an alignment stage 18 positioned below the loading section 17. The solder paste printing apparatus further includes a rotatable transfer stage 21 for wiring boards. A rotary shaft 20 of the transfer stage 21 is set between the loading section 17 and a printing stage 19 so that the transfer stage 21 is rotatably positioned between the loading section 17 and the printing stage 19. The printing stage 19 is equipped with a printing mask.

The transfer stage 21 is rotatable in a direction of an arrow 22 or 23 about the rotary shaft 20 by a direct driving motor 110. A first church 24 and a second chuck are 25 of the transfer stage 21 disposed at diametrically opposed positions relative to the rotary shaft 20 on a base plate 111 of the transfer stage 21 and the chucks serve to hold wiring boards. Other reference numerals are: 26 a recognition camera constituting a position detector, 27a printing squeegee head, 28 a driving part for the squeegee head 27 which can move along a guide member 28a, 29 a cleaning head, 30 a driving part for the cleaning head 29 which can move along a guide member 30a, 31 an arrow indicating a moving direction of the squeegee head 27, 32 a wiring board being before printed, and 33 a wiring board after being printed.

Figure 2:
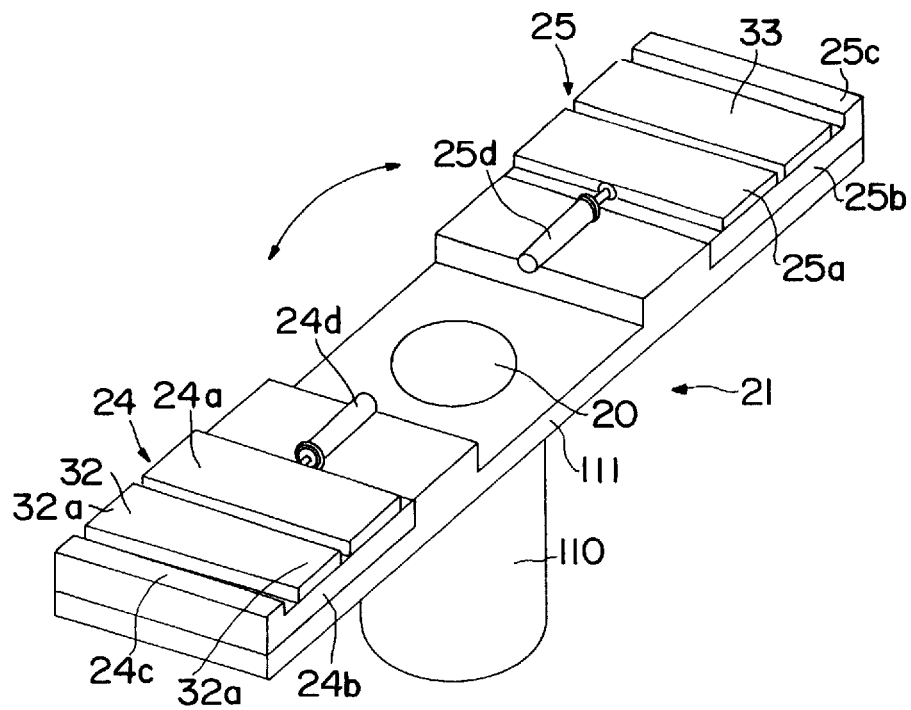
FIG. 2 is a perspective view of a rotatable transfer stage of the apparatus shown in FIG. 1.

As shown in FIG. 2, the chucks 24 and 25 have the same construction as each other and have: fixed plates 24b, 25b with stoppers 24c, 25c; movable plates 24a, 25a slideable on the fixed plates 24b, 25b and capable of holding the wiring boards 32, 33 between the end of the movable plates 24a, 25a and the stoppers 24c, 25c; and actuators 24d, 25d, such as a driving cylinders, for driving the movable plates 24a, 25a to hold the wiring boards between the movable plates 24a, 25a and the stoppers 24c, 25c and release the wiring boards 32, 33 therefrom.

The solder paste printing apparatus in the above-described constitution operates in a manner as follows.

Figure 3:
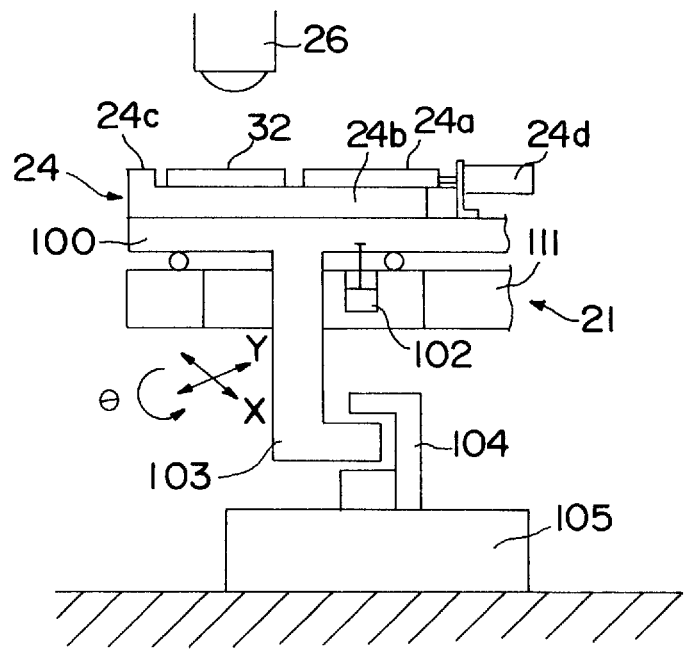
FIG. 3 is an explanatory side view of the rotatable transfer stage of FIG. 2.

The wiring board 32 before being printed which is supplied via the loading guide rail 15 and is held on the transfer stage 21 by the first holding chuck 24. At this time, an outer peripheral edge of the wiring board 32 is retained by the chuck 24. Then, positions of markers 32a formed in the wiring board 32 are recognized by the recognition cameras 26, whereby a positional shift of the wiring board 32 is detected. The position of the wiring board 32 is consequently corrected from outside of the transfer stage 21 by the alignment stage 18 based on a signal indicative of the positional shift, and moved as required with respect to the transfer stage 21 within a plane. That is, as shown in FIG. 3, after the wiring board 32 is held on the chuck 24, an L-shaped projection 103 projects from the lower surface of a movable stage 100 movably positioned on the fixed plate 111 of the transfer stage 21 is held by a chuck 104 of an XYθ stage 105 at the alignment stage 18. For the positional adjustment of the wiring board 32, the XYθ stage 105 can move the movable stage 100 in X, Y, and θ directions on the fixed plate 111 via the chuck 104 and the L-shaped projection 103 of the movable stage 100 in a plane parallel to the surface of the fixed plate 111. Then, based on the signal indicative of the positional shift detected after each recognition camera 26 recognizes each marker 32a on the wiring board 32 held on the chuck 24, the XYθ stage 105 moves its chuck 104 to move the movable stage 100 onto the fixed plate 111 in the X, Y, and θ directions via the L-shaped projection 103 of the movable stage 100 so that the position of the wiring board 32 can be corrected. Thereafter, the positioned movable stage 100 is fixed on the fixed plate 111 by a positioning clamp 102 so as to rotate the movable stage 100 together with the fixed plate 111 around the rotary shaft 20. Then, the L-shaped projection 103 of the movable stage 100 is released from the chuck 104 and the driving motor 110 can rotate the transfer stage 21.

While the transfer stage 21 is rotated 180° in the arrow direction 22 about the rotary shaft 20, the wiring board 32 corrected in position is sent to the printing stage 19. The rotation of the transfer stage 21 is conducted by the brushless DD motor of a direct driving type. After the wiring board 32 is correctly positioned immediately below a printing pattern (openings) of the mask of the printing stage 19, the printing squeegee head 27 is driven by the driving part 28. More specifically, the squeegee head 27 is reciprocated in a direction indicated by an arrow 31 by the driving part 28 under predetermined printing conditions, thereby printing a solder paste on the wiring board 32. During the period, the second holding chuck 25 of the transfer stage 21 is located at the side of the loading section 17, so that a wiring board newly transferred on the loading guide rail 15 is held by the chuck 25 in the same manner as discussed above to be subjected to positional recognition and positional correction by the cameras 26 and alignment stage 18 respectively.

The printing at the printing stage 19 is concurrently proceeding with the positional recognition at the loading section 17. When both operations are completed, the transfer stage 21 is turned 180° in the direction of arrow 23 and positioned. Consequently, the printed wiring board 33 held by the chuck 24 is returned to the loading section 17, then changed and carried out on the unloading guide rail 16. Hence, a fresh wiring board is held by the chuck 24 and corrected in position by the cameras 26 and alignment stage 28, while the wiring board held by the chuck 25 is treated at the side of the printing stage 19.

Since the openings of the printing mask of the printing stage 19 clog in the repetitive printing, the printing mask is cleaned by the cleaning head 29 and driving part 30 after a predetermined number of printing operations.

In the above embodiment, the wiring board 32 held at the outer peripheral edge thereof by the chuck 24, 25 of the transfer stage 21 is corrected in position by the alignment stage 18 at the side of the loading section 17. However, the alignment stage 18 may be set at the side of the printing stage 19 to move the mask of the printing stage 19 on the basis of the detecting signal of the positional shift. Alternatively, the mask may be positionally corrected while the transfer stage 21 is turned 180°, whereby a loss of time is further eliminated. The camera as a position detector may be installed each at the side of the loading section 17 and at the side of the printing mask in order to shorten a recognition time.

Although the solder paste is printed on the wiring board in the embodiments, the present invention can be applied to a case where a conductive material such as gold, silver, and copper alloy instead of the solder paste is be printed on a board through known printing method such as screen printing.

Figure 4:
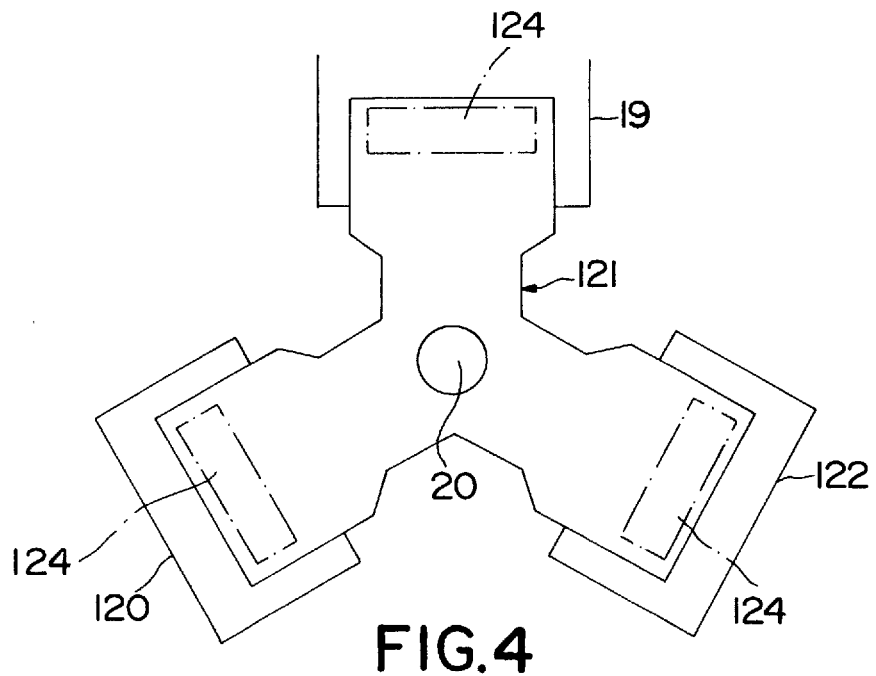
FIG. 4 is a plan view of a rotatable transfer stage of a solder paste printing apparatus in accordance another embodiment of the present invention.
Figure 5:
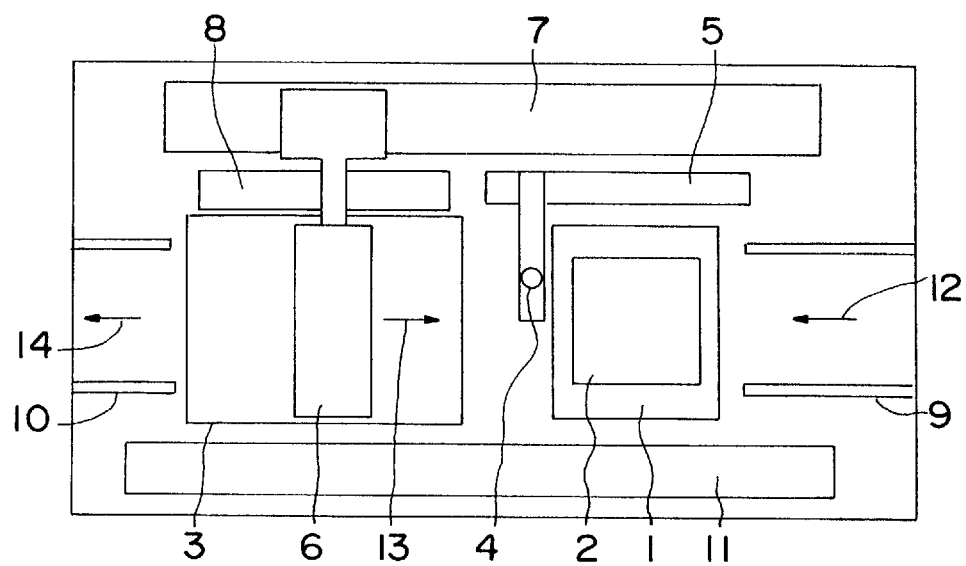
FIG. 5 is a plan view showing a conventional solder paste printing apparatus.

Moreover, the present invention is not limited to two positions of the printing position and the loading and alignment position where the transfer stage 21 stops. That is, as shown in FIG. 4, a transfer stage 121 has three chucks 124 which are spaced at every 120 degrees and have the same construction and function as the chuck 24 or 25 and turns every 120 degrees and stops at three position, a loading position 120 where a new wiring board before printing is held by the chuck 124 and a printed wiring board is taken out from the chuck 124, an alignment position where the wiring board held by the chuck 124 is corrected in position as mentioned above, and the printing position (printing stage 19) as mentioned above.

As is described hereinabove, since the printing operation is carried out concurrently with the loading operation in the present invention, the apparatus improves productivity greatly. Moreover, since the wiring board or printing mask is aligned and corrected on the basis of an output generated when a positional shift of the wiring board is detected at the side of the loading section, the apparatus enables highly accurate printing of a solder paste.

That is, according to the present invention, the transfer means has holding means for holding the wiring boards and turns to transfer the holding means and stop the holding means at the loading, printing, and alignment sections at the same time so that loading, printing, and alignment operations are simultaneously performed. When one holding means is located at the loading section, the other holding means can be located at the printing section, so that a position of the wiring board is detected by the position detecting means concurrently when the wiring board is printed with the use of the mask. In comparison with the conventional constitution wherein the printing is carried out after the position of the wiring board is detected and corrected, the processing time can be remarkably reduced in the present invention.

Moreover, since a new wiring board can be positionally corrected at the alignment section or the printed wiring board can be sent to an unloading section, while the wiring board at the loading section is transferred to the printing section, the time required for transfer of the wiring boards is also shortened. Accordingly, the present invention is effective to increase a processing number of wiring boards per facility area, with enhancing a working efficiency.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A printing apparatus comprising:
   a rotatable transfer device including holding means for holding boards, said transfer device being rotatable so as to transfer said holding means from a first position through an angle of 180 degrees to a second position;
   a loading section for guiding the boards onto said holding means at said first position;
   a printing section having a mask for printing a conductive material onto each of the boards held by said holding means at said second position;
   a position detector for detecting a position of the board held by said holding means and outputting a signal indicative of the detected position; and
   an alignment section for correcting a position of said mask or the board held by said holding means on the basis of an output signal from said position detector,
   wherein said transfer device is operable to stop said holding means at said loading, printing, and alignment sections such that loading, printing, and alignment operations can be simultaneously performed.

2. The printing apparatus as claimed in claim 1, wherein said loading section is located at the same position as said alignment section.

3. The printing apparatus as claimed in claim 1, further comprising a board unloading position located at said first position, wherein said transfer device is rotatable through an angle of 180 degrees to return said holding means to said first position such that a printed board can be unloaded at said first position.

4. A printing apparatus comprising:
   a rotatable transfer stage mounted on a rotary shaft and having first and second ends, said rotatable transfer device being rotatable about said rotary shaft;
   a first board holder provided on said first end of said rotatable transfer stage;
   a second board holder provided on said second end of said rotatable transfer stage;
   a board loading guide for loading boards onto said first and second board holders at a first position;
   a board unloading guide disposed on an opposite side of said transfer device relative to said loading guide, said board unloading guide being operable to unload boards from said first and second board holders at said first position;
   a printing stage disposed at a second position and provided with a mask, said printing stage being diametrically opposed to said loading and unloading guides relative to said rotary shaft;
   a position detector for detecting a position of boards hold by each of said first and second board holders; and
   an alignment stage positioned under said rotatable transfer device for aligning a position of said mask or the boards held by said first and second board holders in response to an output signal from said position detector,
   wherein said transfer stage rotates through an angle of 180 degrees to transfer said first holder from said first position between said loading and unloading guides to said second position at said printing stage, and to transfer said second holder from said second position to said first position.

5. The printing apparatus as claimed in claim 4, wherein each of said first and second holders comprises:
   a fixed plate including a stopper;
   a movable plate slidably disposed on said fixed plate; and
   an actuator for moving said movable plate toward and away from said stopper to secure and release a board positioned therebetween.

* * * * *